(12) United States Patent
Hu

(10) Patent No.: US 11,222,962 B2
(45) Date of Patent: Jan. 11, 2022

(54) EDGE TERMINATION DESIGNS FOR SUPER JUNCTION DEVICE

(71) Applicant: Jun Hu, San Bruno, CA (US)

(72) Inventor: Jun Hu, San Bruno, CA (US)

(73) Assignee: HUNTECK SEMICONDUCTOR (SHANGHAI) CO. LTD., Shanghai (CN)

(*) Notice: Subject to any disclaimer, the term of this patent is extended or adjusted under 35 U.S.C. 154(b) by 0 days.

(21) Appl. No.: 15/162,397

(22) Filed: May 23, 2016

(65) Prior Publication Data

US 2017/0338301 A1 Nov. 23, 2017

(51) Int. Cl.
| | |
|---|---|
| *H01L 29/66* | (2006.01) |
| *H01L 29/06* | (2006.01) |
| *H01L 29/78* | (2006.01) |
| *H01L 21/3065* | (2006.01) |
| *H01L 21/308* | (2006.01) |
| *H01L 21/304* | (2006.01) |
| *H01L 21/266* | (2006.01) |
| *H01L 21/761* | (2006.01) |
| *H01L 29/40* | (2006.01) |

(52) U.S. Cl.
CPC ...... *H01L 29/66712* (2013.01); *H01L 21/266* (2013.01); *H01L 21/304* (2013.01); *H01L 21/308* (2013.01); *H01L 21/3065* (2013.01); *H01L 21/761* (2013.01); *H01L 29/0615* (2013.01); *H01L 29/0619* (2013.01); *H01L 29/0634* (2013.01); *H01L 29/0638* (2013.01); *H01L 29/404* (2013.01); *H01L 29/7811* (2013.01)

(58) Field of Classification Search
CPC .............. H01L 29/0623; H01L 29/402; H01L 29/7811; H01L 29/063; H01L 29/0634; H01L 29/0619; H01L 29/66712; H01L 29/0615; H01L 29/0638; H01L 29/404
USPC ........................................................ 257/490
See application file for complete search history.

(56) References Cited

U.S. PATENT DOCUMENTS

| | | | | |
|---|---|---|---|---|
| 9,082,845 | B1* | 7/2015 | Seok | H01L 29/7811 |
| 2006/0006458 | A1* | 1/2006 | Motai | H01L 29/0634 |
| | | | | 257/330 |
| 2006/0220156 | A1* | 10/2006 | Saito | H01L 29/0619 |
| | | | | 257/409 |
| 2007/0228490 | A1* | 10/2007 | Kocon | H01L 29/0634 |
| | | | | 257/401 |
| 2008/0237701 | A1* | 10/2008 | Willmeroth | H01L 29/0634 |
| | | | | 257/328 |

(Continued)

*Primary Examiner* — Khiem D Nguyen
(74) *Attorney, Agent, or Firm* — Bo-In Lin

(57) ABSTRACT

This invention discloses a semiconductor power device formed on an upper epitaxial layer of a first conductivity type supported on a semiconductor substrate comprises an active cell area and a termination area disposed near edges of the semiconductor substrate. The semiconductor power device having a super junction structure with the epitaxial layer formed with a plurality of doped columns of a second conductivity type. The termination area further comprises a plurality of surface guard ring regions of the second conductivity type dispose near a top surface of the epitaxial layer close to the doped columns of the second conductivity type. In one of the embodiments, one of the surface guard ring regions extending laterally over several of the doped columns in the termination area.

14 Claims, 10 Drawing Sheets

(56) References Cited

U.S. PATENT DOCUMENTS

| | | | | |
|---|---|---|---|---|
| 2008/0315297 A1* | 12/2008 | Takashita | .......... | H01L 21/26513 |
| | | | | 257/328 |
| 2009/0079002 A1* | 3/2009 | Lee | ................. | H01L 29/0634 |
| | | | | 257/355 |
| 2010/0230750 A1* | 9/2010 | Saito | ................. | H01L 29/0634 |
| | | | | 257/341 |
| 2011/0204442 A1* | 8/2011 | Guan | ................. | H01L 29/0634 |
| | | | | 257/342 |
| 2011/0241172 A1* | 10/2011 | Kocon | ............... | H01L 29/0634 |
| | | | | 257/618 |
| 2012/0161231 A1* | 6/2012 | Tamaki | .................. | H01L 24/05 |
| | | | | 257/335 |
| 2012/0273884 A1* | 11/2012 | Yedinak | ............. | H01L 29/0634 |
| | | | | 257/341 |
| 2012/0276701 A1* | 11/2012 | Yedinak | ............... | H01L 29/872 |
| | | | | 438/270 |
| 2015/0303268 A1* | 10/2015 | Ishimaru | ............ | H01L 21/2253 |
| | | | | 363/37 |
| 2015/0333118 A1* | 11/2015 | Eguchi | ............. | H01L 29/66477 |
| | | | | 257/493 |
| 2016/0204192 A1* | 7/2016 | Abiko | .............. | H01L 29/66727 |
| | | | | 257/341 |
| 2016/0284794 A1* | 9/2016 | Bobde | ................ | H01L 29/0615 |

* cited by examiner

EDGE TERMINATION DESIGNS FOR SUPER JUNCTION DEVICE

FIELD OF THE INVENTION

The invention relates generally to semiconductor power devices. More particularly, this invention relates to new configurations and methods for manufacturing improved power device with new edge termination configurations that implement super junction structures with surface guard rings to improve the device reliability and the unclamped inductive switching (UIS) capability.

DESCRIPTION OF THE RELATED ART

Conventional technologies to configure and manufacture semiconductor power devices operating at the higher voltage are still confronted with difficulties and limitations. Particularly, the configurations and designs of the termination area of a device implemented with super junction structures are critical due to the limitation of crowding of electrical fields that can often leads to device vulnerability and causes unreliable device operations. For these reasons, the configurations and designs of termination are critically important especially for the super junction devices that require the termination area to sustain a higher breakdown voltage.

Furthermore, in order to improve the performances of a semiconductor power device, it is required to improve the unclamped inductive switch (UIS) capability. Additionally, a durable semiconductor power device requires that the device has high operational and integrity reliability and can achieve high degree of device robustness. For these reasons, it is necessary to design the termination area, especially those implemented with super junction structures, with improved characteristics of electrical field spreading across the entire termination area to prevent local electrical field crowding in any particular locations and near the top surface of the termination area.

Different designs of the termination area have been disclosed. In US Patent Application US 20130140633, a termination design with super junction structure is disclosed and illustrated in FIG. 1A. Upon a detail examination and analysis, it is clear that the device reliability is adversely impacted due to the uneven distribution of the electrical field in the termination area. Furthermore, it is not suitable for super junction structure using trench-etch and filling process.

FIGS. 1B, 1C, and 1D show the super junction devices disclosed by U.S. Pat. Nos. 8,772,868, and 7,655,981, and United States Patent Application 20100264489 respectively. In these device configurations, the termination areas have a wider isolation N-type mesa than the active area so that the active area is more P-rich. Therefore, the breakdown is always lower than the voltage capability of the designed epi. Additionally, under the unclamped inductive switching (UIS) condition, the breakdown occurs at the active area first and the device temperature increase dramatically. The device will be damaged immediately when the breakdown location moves to the termination region, which may limit the device UIS performance For the above reasons, there is a need to provide new device configurations and new manufacturing methods for the semiconductor power devices implemented with super junction structures to reduce the peak electrical field in the termination area for increasing the device reliability and robustness of the power device. It is further necessary to provide the new device configuration and manufacturing methods to provide new and improved power devices to improve the UIS capabilities such that the above discussed difficulties and limitations can be resolved.

SUMMARY OF THE PRESENT INVENTION

It is an aspect of the present invention to provide a new and improved device configuration and manufacturing method for providing a semiconductor power device implemented with super junction structures with improved termination structure to achieve good unclamped inductive switch (UIS) capability, improved robust and better device reliability without sacrifice the breakdown voltage rating of the device.

Another aspect of the present invention is to provide a new and improved device configuration and manufacturing method for providing a semiconductor power device implemented with super junction structures to have new termination super junction structures with surface guard rings to achieve an evenly distributed electrical field spreading through the termination area to prevent the electrical field crowding at the surface thus improving the device reliability.

Specifically, an aspect of the present invention is to provide a new and improved device configuration and manufacturing method for providing a semiconductor power device implemented with super junction structures to have new termination structures wherein guard ring regions are formed near the surface close to the super junction doped columns. The distribution of the electric field is spread out thus reducing the electrical field crowding and improving the device reliability and the UIS capability is improved.

Briefly in a preferred embodiment this invention discloses a semiconductor power device formed on an upper epitaxial layer of a first conductivity type supported on a semiconductor substrate comprises an active cell area and a termination area disposed near edges of the semiconductor substrate. The semiconductor power device having a super junction structure with the epitaxial layer formed with a plurality of doped columns of a second conductivity type. The termination area further comprises a plurality of surface guard ring regions of the second conductivity type dispose near a top surface of the epitaxial layer close to the doped columns of the second conductivity type. In one of the embodiments, one of the surface guard ring regions extending laterally over several of the doped columns in the termination area.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENTS

Figure 1A:
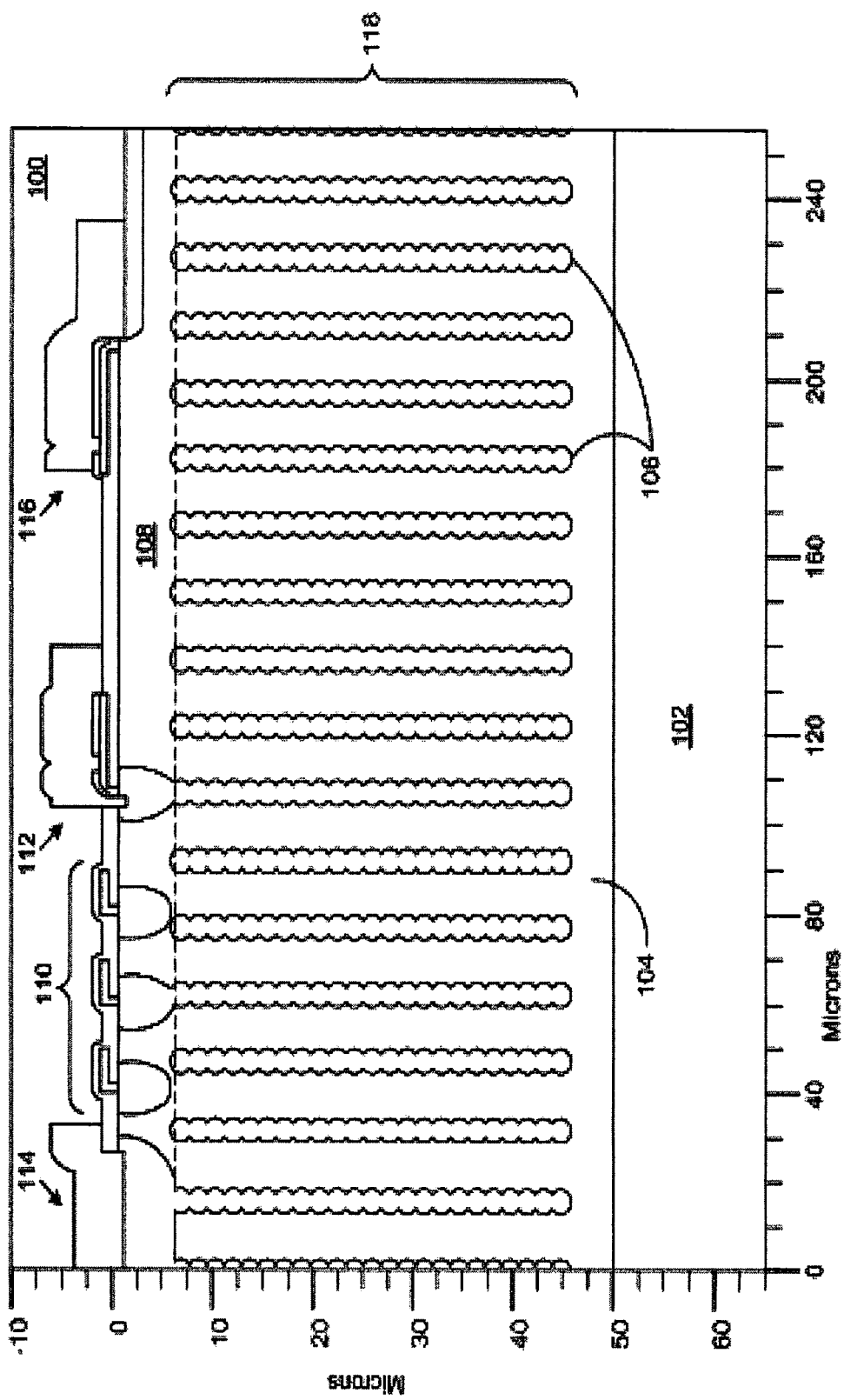
FIGS. 1A to 1D are cross sectional views showing four different termination configurations of the conventional super junction semiconductor power devices.
Figure 1B:
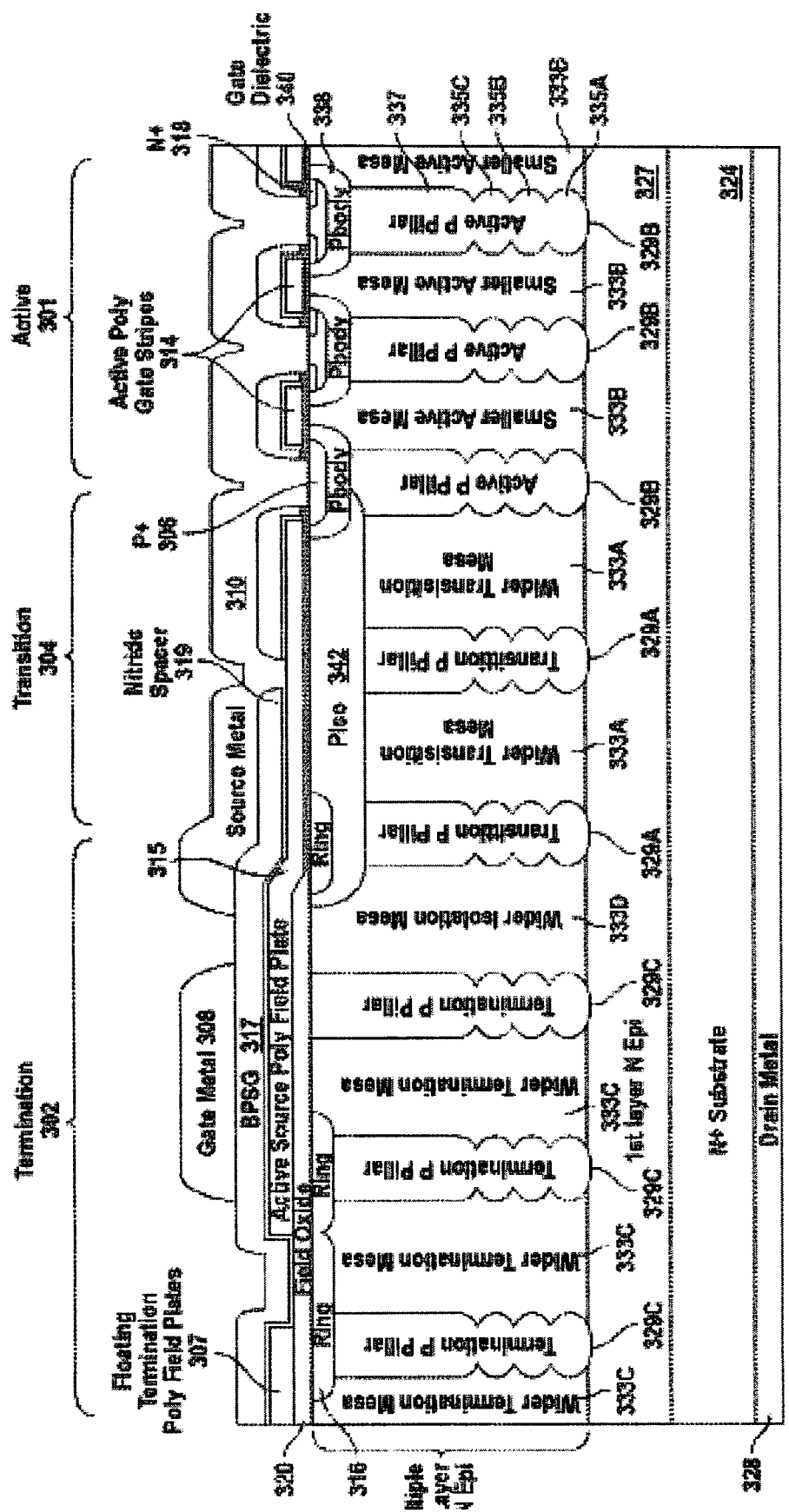
Figure 1C:
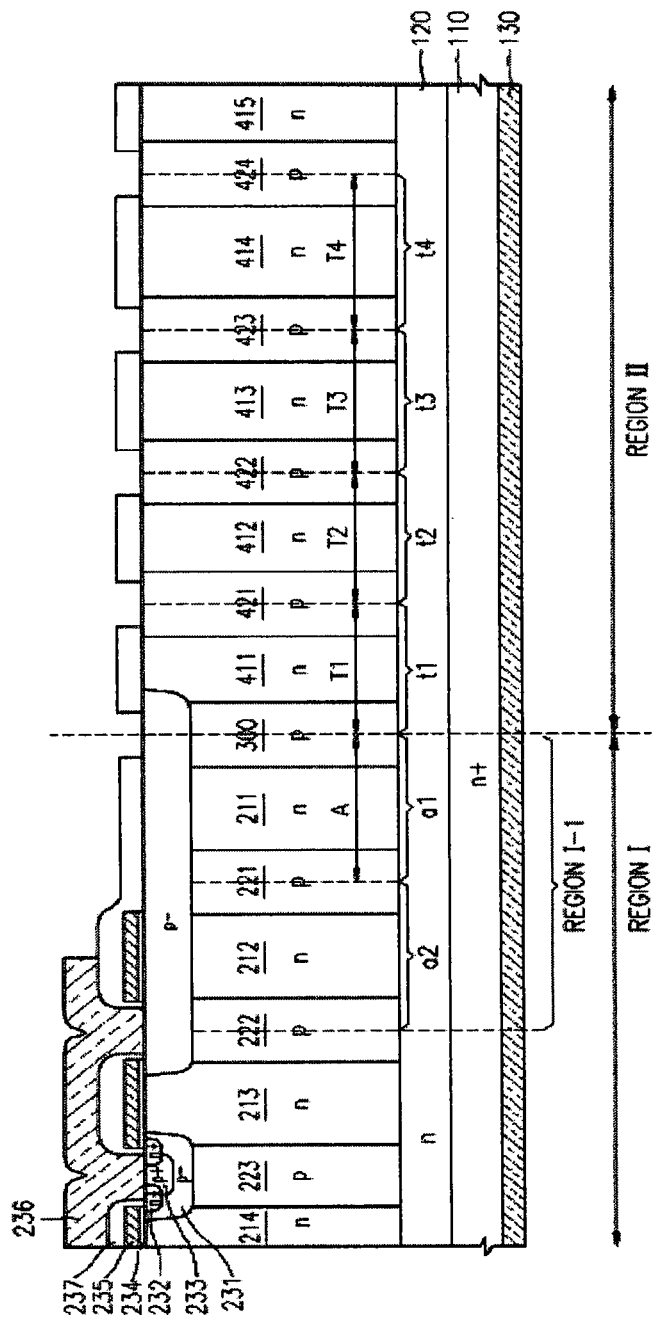
Figure 1D:
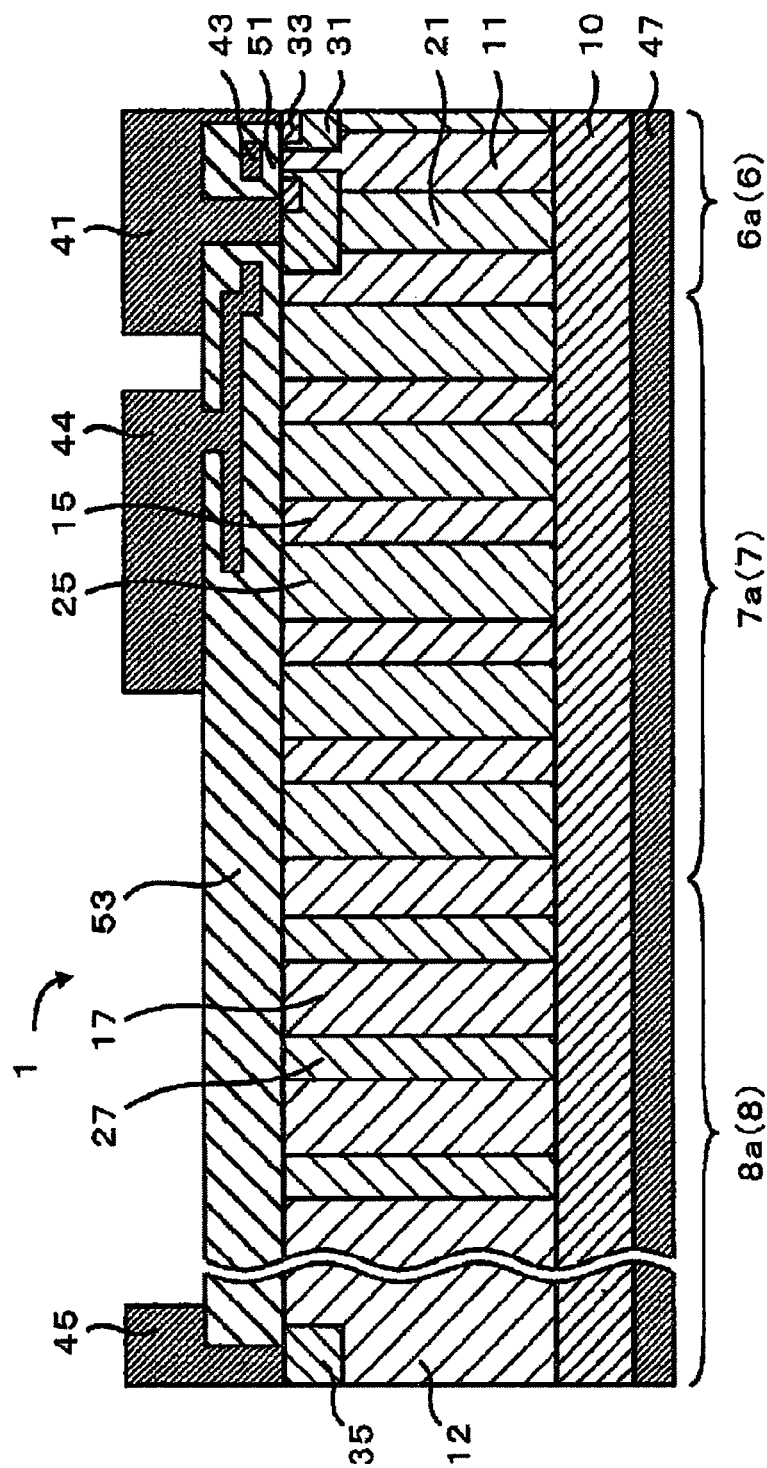
Figure 2:
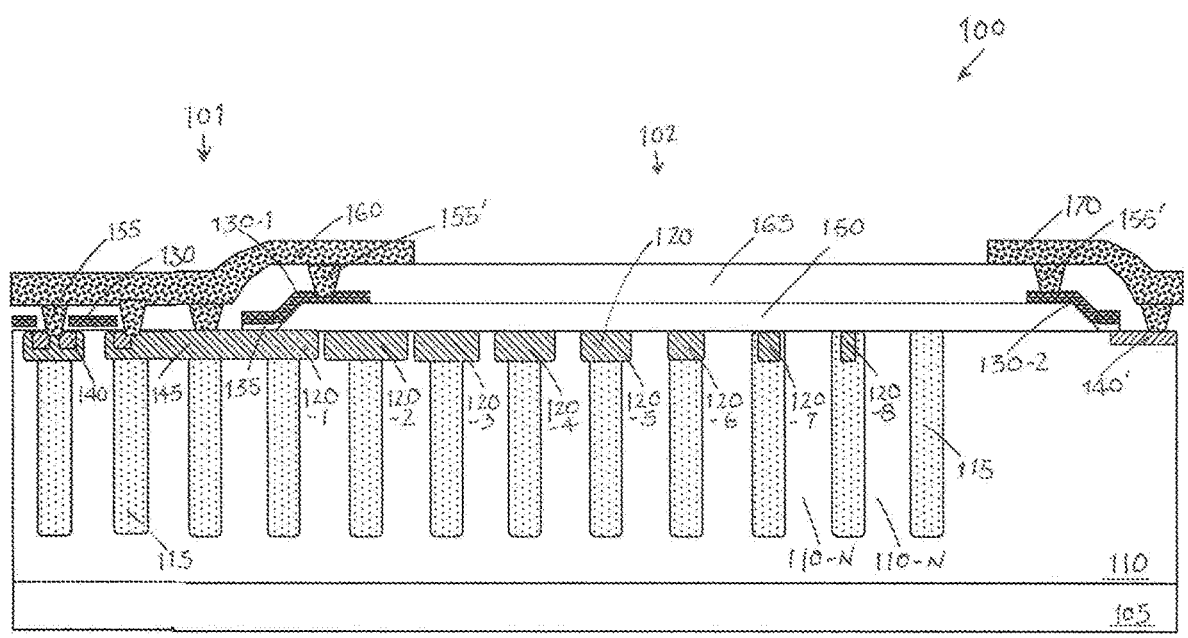
FIG. 2 is a cross sectional view of a super junction MOSFET device implemented with the surface guard rings in the termination area of this invention.

FIG. 2 is a cross section view of a semiconductor power device 100 as a preferred embodiment of this invention. The semiconductor power device 100 includes an active cell area 101 and a termination area 102 and is formed on an N-type semiconductor substrate 105 supporting an N-type epitaxial layer 110 on top of the bottom substrate layer 105. The epitaxial layer 110 is formed with a super junction structure with the epitaxial layer 110 comprises a plurality of P-columns 115 separated by the 110-N regions between two adjacent P-columns 115. In order to improve the device reliability and the UIS capability, this invention implements a new and improved termination configuration by implanting a plurality of guard rings 120 near the top surface of the epitaxial layer. With the guard rings immediately below the top surface, the surface electric-field can be controlled to distributed over the termination area 102. The device reliability and the UIS capability is improved. As shown in FIG. 2, the guard ring 120-1 that is formed immediately next to the active cell area 101 has a longest lateral length that extends over three P-columns 115 while the guard rings 120-2 to 120-8 have gradually reduced lateral lengths.

As shown in FIG. 2, in an exemplary embodiment, the active cell area 101 comprises a plurality of MOSFET transistor cells disposed on top of the super junction structure wherein the distance between two P-columns 115 in the active cell area 101 is equal to the distance between two P-columns in the termination area 102. Each transistor cell in the active cell area includes a planar polysilicon gate 130 padded by a gate oxide 135 underneath the gate 130 on top surface of the epitaxial layer 110. The planar gate 130 extended laterally over two p-columns 115 with a P-type body region 140 encompassing an N-type source region 145 formed on top of the P-column 115. The termination area 102 is covered by a field oxide layer as a first insulation layer 150 in the termination area and a top insulation layer 165 is formed to cover the top surface of the active cell area and the termination area. Through the top insulation layer are contact trenches opened therethrough to provide a source contact 155 to electrically connect the body and source regions to the source metal 160 on top of the insulation layer 165. The source metal 160 is further electrically connected to a first floating polysilicon segment 130-1 disposed on top of field oxide 150. A field plate 170 is formed at the outer edge of the device on top of the top insulation layer 165. The channel stop is formed by the outmost N-type doped region 140', which is implanted simultaneously with the source implant. The field plate 170 is electrically connected to an outmost N-type doped region 140' and also to a second floating polysilicon segment 130-2 disposed on top of the oxide filed layer 150.

Figure 3:
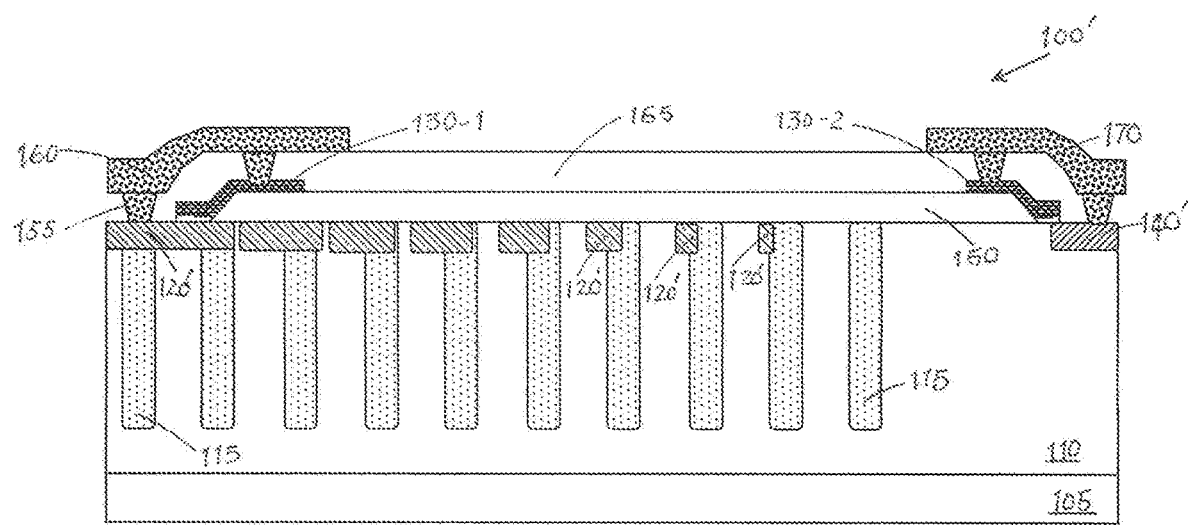
FIGS. 3 and 4 are cross sectional views of alternate super junction MOSFET devices implemented with the surface guard rings in the termination area of this invention.

FIG. 3 is a cross section view of an alternate embodiment of this invention. The semiconductor power device 100' is formed on a super junction structure with the P-columns 115 similar to the device of FIG. 2. The major differences between the device 100' and the device 100 as that shown in FIG. 2 are the configuration of the surface guard rings 120'. The guard rings 120' of device 100' are formed with width and spacing that independent from the P-columns 115. Furthermore, in device 100', the outer surface guard rings 120' are formed on the side of the P-columns 115 thus the outer surface guard rings 120' are closer to the active cell area 101.

Figure 4:
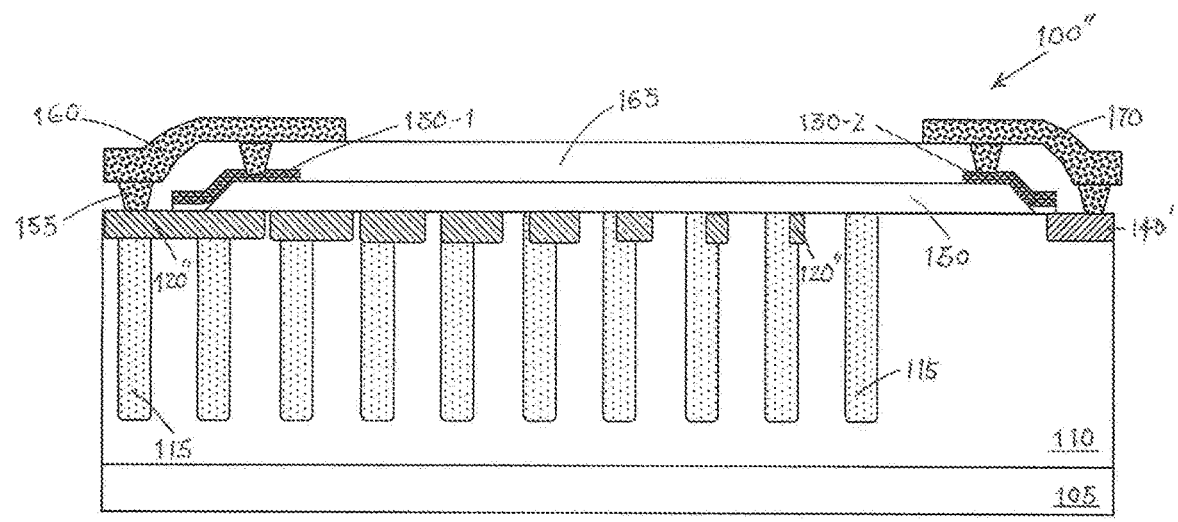

FIG. 4 is a cross section view of another alternate embodiment of this invention. The semiconductor power device 100" is formed on a super junction structure with the P-columns 115 similar to the device of FIGS. 2 and 3. The major differences between the device 100' and the device 100 as that shown in FIG. 2 are the configuration of the surface guard rings 120'. The guard rings 120" of device 100' are formed with width and spacing that independent from the P-columns 115. Furthermore, in device 100", the surface guard rings 120" are formed on the side of the P-columns 115 thus the outer surface guard rings 120" are formed opposite and farther from the active cell area 101.

Figure 5A:
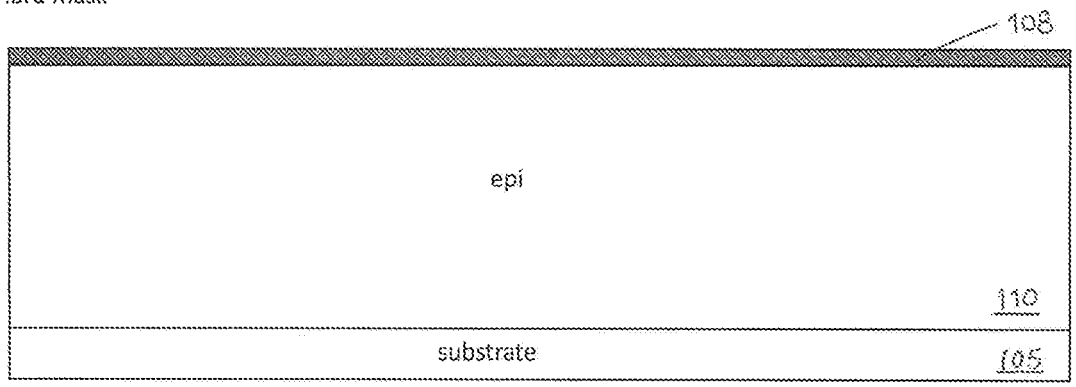
FIGS. 5A to 5K are a series of cross sectional views for illustrating the manufacturing processes of devices shown in FIG. 2.
Figure 5B:
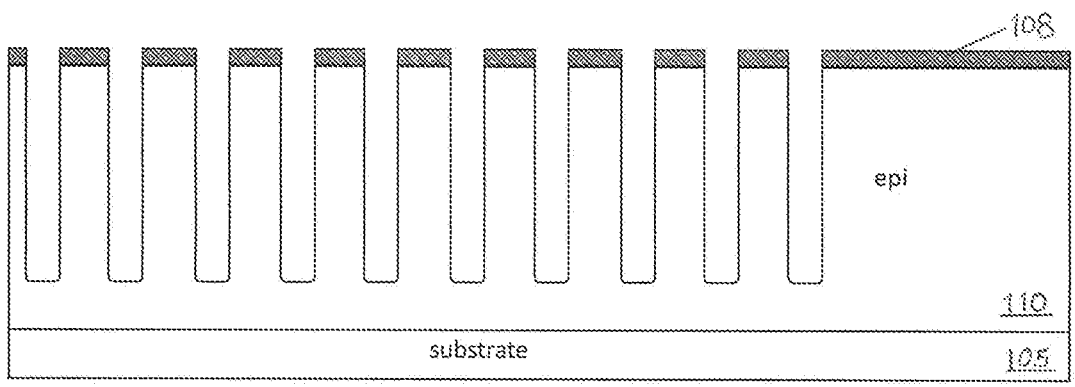
Figure 5C:
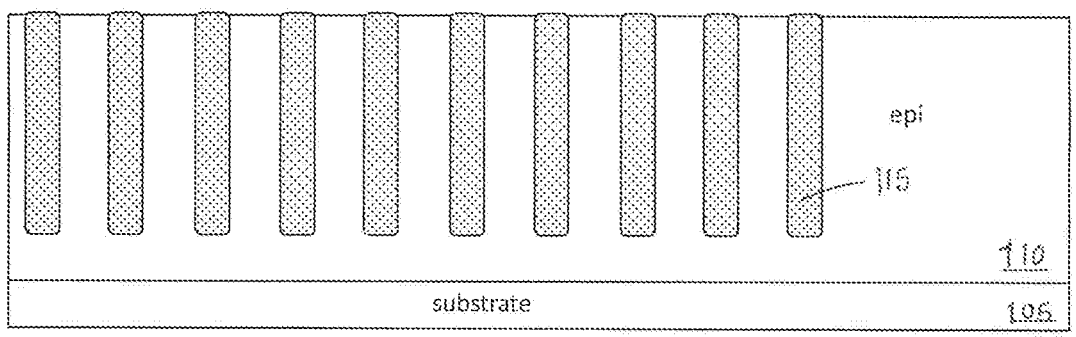
Figure 5D:
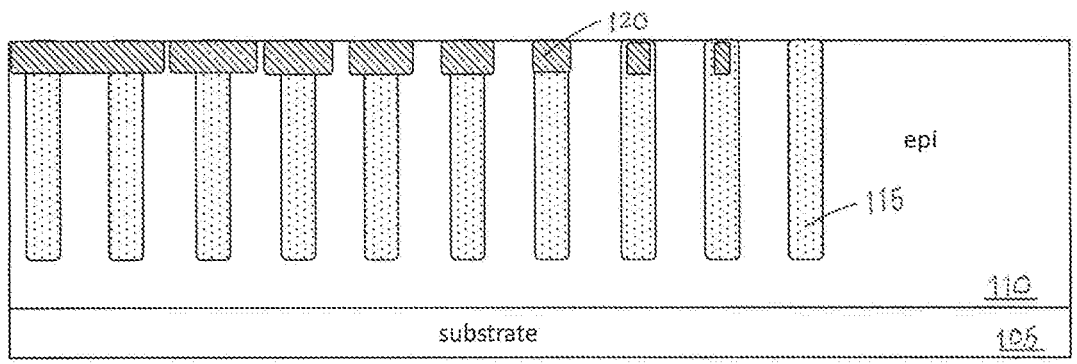

FIGS. 5A-5K are a series of cross sectional views to show the fabrication processes of a semiconductor power device shown in FIGS. 2 to 4. In FIG. 5A, a hard mask 108 is deposited at first on top of the epitaxial layer 110 supported on the silicon substrate 105. In FIG. 5B, a trench mask (not shown) is applied on top of the hard mask 108 to carry out a trench etch process to open a plurality of trenches in the epitaxial layer 110. In FIG. 5C, the hard mask 108 is removed followed by necessary steps to smooth the trench sidewalls including a sacrificial oxidation and an oxide-etch to remove the damaged surface on the trench wall. Then the trenches are filled with a P-type epitaxial layer to form P-columns 115 in the N-type epitaxial layer 110 followed by a planarization process. The P-columns can also be alternately formed by multiple epitaxial growth process with masked P-type implantation after each epitaxial growth. In FIG. 5D, a top guard ring implant is carried out by applying a guard ring implant mask (not shown) to form the top surface guard ring regions 120. The P-type body implant in the core cell in the active area can also be formed at the same time. Depending on the different process conditions and requirements on threshold voltage (Vth). The P-type body implant can be formed separately in the later process.

Figure 5E:
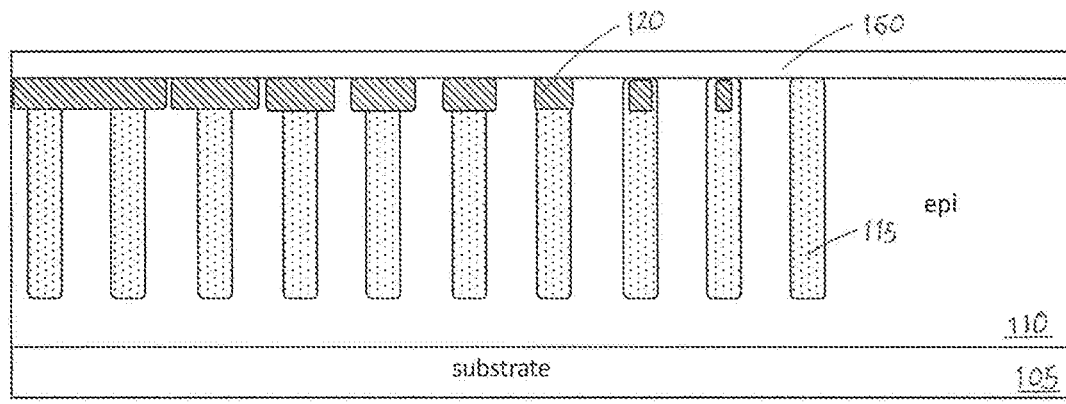
Figure 5F:
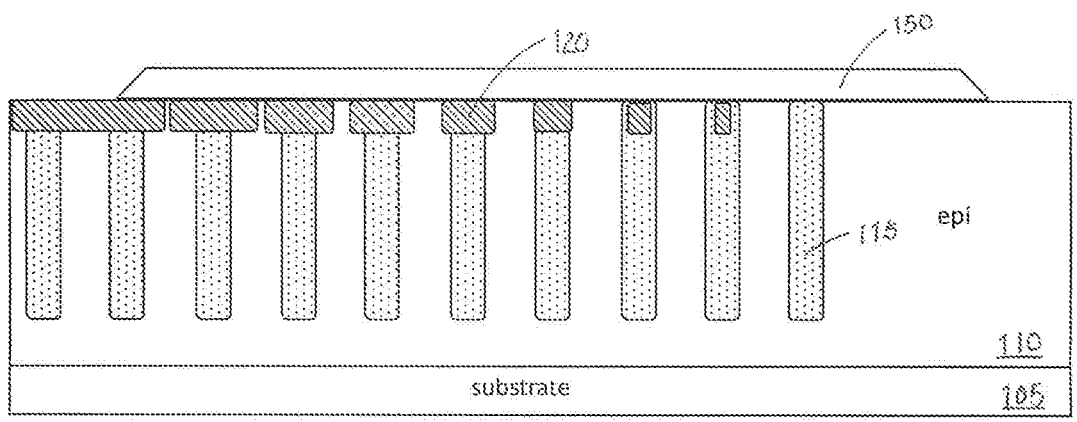
Figure 5G:
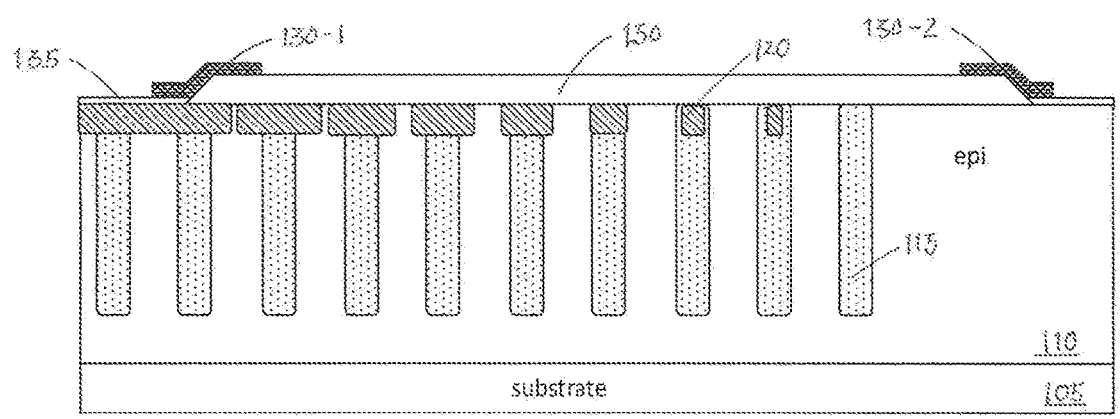
Figure 5H:
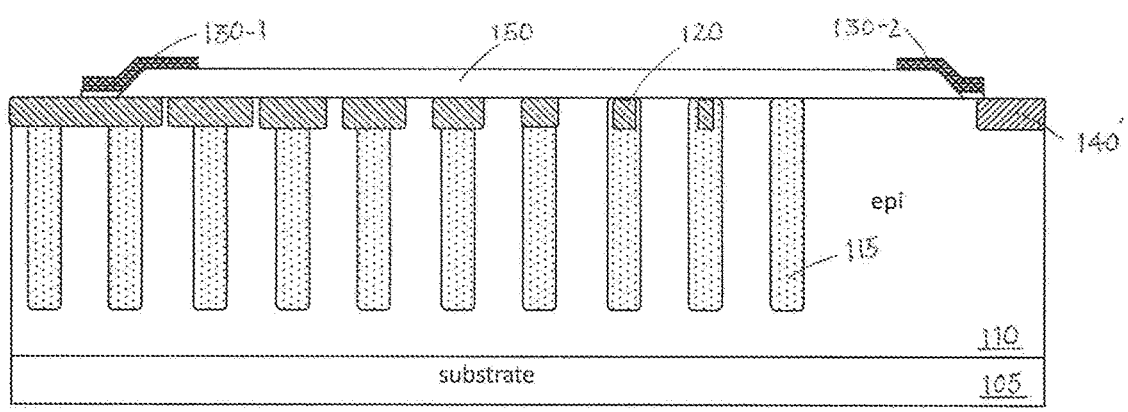

In FIG. 5E, a filed oxide layer 150 is deposited on top of the epitaxial layer 110 and in FIG. 5F, a mask (not shown) is applied to etch the field oxide layer 150 to open up the active area for further device manufactures. In FIG. 5G, a gate oxide layer 135 is deposited followed by depositing and patterning of polysilicon layer to form gate 130 (shown in FIG. 2) and polysilicon segments 130-1 and 130-2. In FIG. 5H, the P-type body implant is skipped because it shares the same implant when the P-type surface guard rings is formed. Alternately, another body implant can be carried out to adjust the threshold voltage (Vth) of the device (not shown in FIG. 2). A source implant is carried out to form the source regions 145 encompassed in the body regions and the outmost channel stop region 140' (shown in FIG. 2).

Figure 5I:
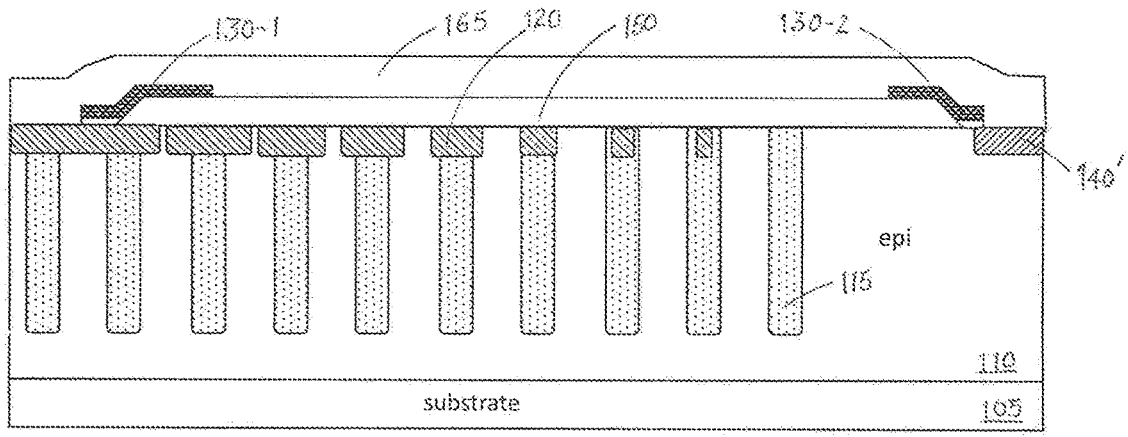
Figure 5J:
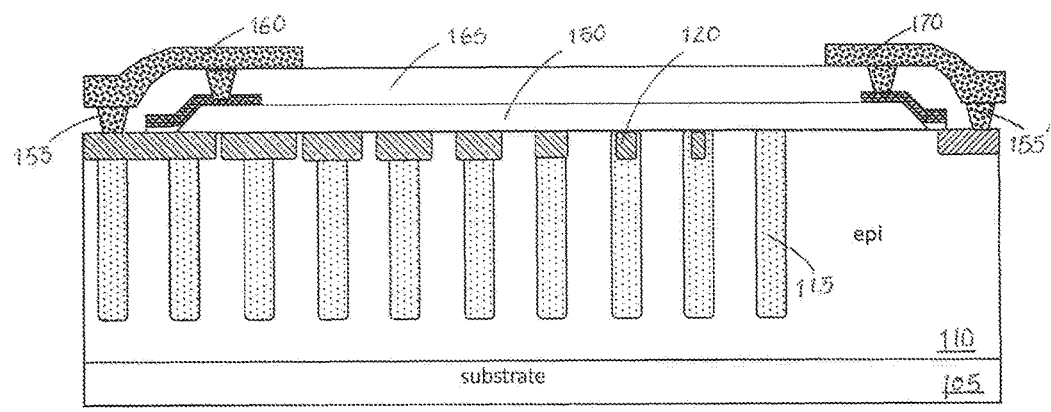
Figure 5K:
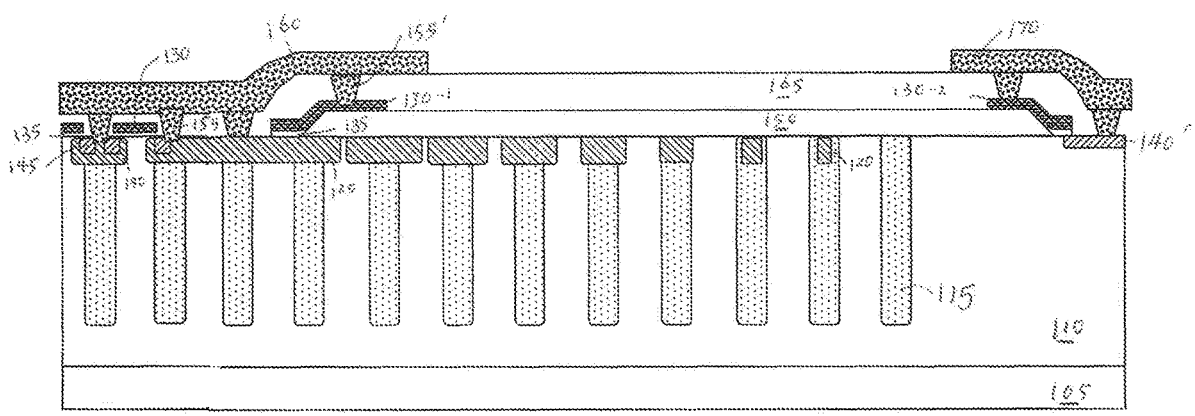

In FIG. 5I, a local thermal oxide (LTO) and BPSG deposition processes are performed to form an insulation layer 165 covering over the field oxide 150 and the top surface of the semiconductor power device. In FIG. 5J, a contact trench etch is performed to open contact trench through the passivation/insulation layer 165 followed by filling the contact trench with a barrier layer metal and a contact metal layer to form trench contacts 155. Then the processes are completed with the deposition and patterning of the top metal layer to form the source metal 160 and the terminal field plate 170. In the termination area, the field plate 170 is electrically connected to the outer edge N-type doped regions 140' and the second polysilicon segment 130-2 through the trench contacts 155 that penetrate through the insulation layer 165 to form the channel stop of the device. In FIG. 5K, a super junction MOSFET device is shown as a final product that is also shown in FIG. 2.

Although the present invention has been described in terms of the presently preferred embodiment, it is to be understood that such disclosure is not to be interpreted as limiting. For example, though the conductivity types in the examples above often show an n-channel device, the invention can also be applied to p-channel devices by reversing the polarities of the conductivity types. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor power device formed on an upper epitaxial layer of a first conductivity type supported on a semiconductor substrate comprises an active cell area and a termination area disposed near edges of the semiconductor substrate wherein: the semiconductor device having a super junction structure with a plurality of doped columns of a second conductivity type disposed in the epitaxial layer; and a plurality of surface guard ring regions of the second conductivity type dispose in the termination area having different lateral widths extending laterally underneath a field oxide layer disposed on top of a top surface of the epitaxial layer contacting the doped columns of the second conductivity type wherein at least one of the surface guard ring regions is disposed completely inside one of the doped columns and having at least one of the surface guard ring regions that is completely inside the doped columns has a width narrower than one of the doped columns of the second conductivity type wherein side surfaces of the at least one of the surface guard ring regions are spaced apart from side surfaces of the one of the doped columns of the second conductivity type, wherein at least one of the surface guard rings regions of the second conductivity type extending laterally over at least two of the doped columns of the second conductivity type underneath the top surface of the epitaxial layer, and wherein the surface guard ring regions of the second conductivity type having gradually decreasing lateral lengths underneath the top surface of the epitaxial layer as each of the guard ring regions disposing further away from the active cell area.

2. The semiconductor power device of claim 1 wherein:
at least one of the surface guard ring regions of the second conductivity type disposed completely inside one of the doped columns of the second conductivity type and having substantially a same width as one of the doped columns of the second conductivity type underneath the top surface of the epitaxial layer.

3. The semiconductor power device of claim 1 wherein:
at least one of the surface guard ring regions of the second conductivity type is disposed immediately adjacent and contacting one of the doped columns of the second conductivity type and having a width narrower than a width between the doped column of the second conductivity adjacent to each other.

4. The semiconductor power device of claim 1 wherein:
the surface guard ring region of the second conductivity type that is disposed completely inside one of the doped columns and having a width narrower than the doped columns of the second conductivity type is disposed completely inside the doped columns of the second conductivity type that is closest to an outer edge of the termination area.

5. The semiconductor power device of claim 3 wherein:
the surface guard ring region that is disposed immediately adjacent and contacting one of the doped columns of the second conductivity type is disposed closer to the active cell area on a side of the doped columns of the second conductivity type.

6. The semiconductor power device of claim 3 wherein:
the surface guard ring region of the second conductivity type that is disposed immediately adjacent and contacting one of the doped columns of the second conductivity type is disposed opposite from the active cell area on a side of the doped columns of the second conductivity type.

7. The semiconductor power device of claim 1 further comprising:
a field plate disposed on the top surface of the epitaxial layer at an outer edge of the semiconductor substrate; and
an outmost ring of the first conductivity type is formed as an channel stop ring disposed at the outer edge of the semiconductor substrate wherein the outmost channel stop ring is disposed under and electrically connected to the field plate.

8. The semiconductor power device of claim 1 wherein:
the active cell area further comprises a MOSFET device.

9. The semiconductor power device of claim 1 wherein:
at least one of the doped columns of the second conductivity type in the termination area does not encompass or in contact with one of the surface guard ring regions.

10. The semiconductor power device of claim 3 wherein:
at least one of the doped columns of the second conductivity type in the termination area does not encompass or in contact with one of the surface guard ring regions.

11. The semiconductor power device of claim 1 wherein:
the surface guard ring regions having a higher dopant concentration than the doped columns of the second conductivity type.

12. The semiconductor power device of claim 3 wherein:
the surface guard ring regions having a higher dopant concentration than the doped columns of the second conductivity type.

13. The semiconductor power device of claim 3 further comprising:
a field plate disposed on the top surface of the epitaxial layer at an outer edge of the semiconductor substrate; and
an outmost ring of the first conductivity type is formed as an channel stop ring disposed at the outer edge of the semiconductor substrate wherein the outmost channel stop ring is disposed under and electrically connected to the field plate.

14. The semiconductor power device of claim 1 wherein:
the active cell area further comprises a MOSFET device that further comprises source regions encompassed in body regions electrically connected to a source metal disposed on top of a passivation layer on top of the field oxide layer.

* * * * *